(12) United States Patent
Johnson et al.

(10) Patent No.: US 7,713,432 B2
(45) Date of Patent: May 11, 2010

(54) METHOD AND APPARATUS TO IMPROVE PLASMA ETCH UNIFORMITY

(76) Inventors: David Johnson, 920 Belted Kingfisher Dr., Palm Harbor, FL (US) 34683; Russell Westerman, 12629 96th St. North, Largo, FL (US) 33773

( * ) Notice: Subject to any disclaimer, the term of this patent is extended or adjusted under 35 U.S.C. 154(b) by 0 days.

(21) Appl. No.: 11/229,319

(22) Filed: Sep. 16, 2005

(65) Prior Publication Data
US 2006/0070703 A1    Apr. 6, 2006

Related U.S. Application Data
(60) Provisional application No. 60/615,860, filed on Oct. 4, 2004.

(51) Int. Cl.
*C03C 15/00*    (2006.01)
(52) U.S. Cl. .............................. 216/67; 216/59; 216/60; 216/61; 156/345; 204/192.13; 134/1.1
(58) Field of Classification Search .................. 216/67; 438/14; 156/345; 204/192.13; 134/1.1
See application file for complete search history.

(56) References Cited
U.S. PATENT DOCUMENTS

| | | | |
|---|---|---|---|
| 5,391,281 A | 2/1995 | Hieronymi et al. | |
| 5,578,165 A | 11/1996 | Patrick et al. | |
| 5,690,781 A | 11/1997 | Yoshida et al. | |
| 5,965,034 A * | 10/1999 | Vinogradov et al. | 216/68 |
| 6,096,232 A | 8/2000 | Hashimoto | |
| 6,210,539 B1 | 4/2001 | Tanaka et al. | |
| 6,217,718 B1 | 4/2001 | Holmann et al. | |
| 6,229,264 B1 | 5/2001 | Ni et al. | |
| 6,274,502 B1 | 8/2001 | Ohkuni | |
| 6,339,206 B1 | 1/2002 | Johnson | |

(Continued)

FOREIGN PATENT DOCUMENTS

JP    06158331    11/1992

(Continued)

OTHER PUBLICATIONS

Lagarde, Journal of Vacuum Science & Technology, vol. 17(1), pp. 118-126, (1999).*

(Continued)

*Primary Examiner*—Duy-Vu N. Deo
*Assistant Examiner*—Maki Angadi
(74) *Attorney, Agent, or Firm*—Harvey Kauget; Phelps Dunbar LLP

(57) ABSTRACT

The present invention provides a method and an apparatus for improving the etch uniformity across a substrate during a plasma etch process that employs the use of an inductively coupled plasma helical inductor. The plasma apparatus comprising a vacuum chamber, a support member in the vacuum chamber for holding the substrate, an etchant gas supply for providing an etchant gas to the vacuum chamber, an exhaust in fluid communication with the vacuum chamber, an RF power source and a helical inductor disposed around or near a portion of the vacuum chamber. A sensor is provided for measuring a process attribute to generate a signal to a controller that then controls a mechanism that varies the position of the helical inductor so that the uniformity of the plasma etch is improved.

12 Claims, 8 Drawing Sheets

U.S. PATENT DOCUMENTS

| | | |
|---|---|---|
| 6,531,029 B1 | 3/2003 | Ni et al. |
| 6,531,031 B1 | 3/2003 | Becker et al. |
| 6,617,794 B2 | 9/2003 | Barnes et al. |
| 7,018,553 B2 * | 3/2006 | Liu et al. ............... 216/60 |
| 7,019,253 B2 * | 3/2006 | Johnson et al. ........ 219/121.36 |
| 2002/0041160 A1 | 4/2002 | Barnes et al. |
| 2002/0124963 A1 | 9/2002 | Kazumi et al. |
| 2003/0106645 A1 | 6/2003 | Ni et al. |
| 2005/0103444 A1 * | 5/2005 | Brcka .................. 156/345.48 |

FOREIGN PATENT DOCUMENTS

JP   2003234293   2/2002

OTHER PUBLICATIONS

Gabriel, MICRO, Jun. 2001.*

* cited by examiner

Schematic of ICP Reactor (prior art)

Plasma Density Distribution – prior art

Plasma density – Radial Movement

Etch Depth Uniformity – Baseline

Etch Depth Uniformity – Radial Movement

Plasma Density – Angular Movement

Plasma Density – Plasma Feedback

Plasma Density – Substrate Feedback

METHOD AND APPARATUS TO IMPROVE PLASMA ETCH UNIFORMITY

CROSS REFERENCES TO RELATED APPLICATIONS

This application claims priority from and is related to commonly owned U.S. Provisional Patent Application Ser. No. 60/615,860 filed Oct. 4, 2004, entitled: A Method and Apparatus to Improve Plasma Etch Uniformity, this Provisional Patent Application incorporated by reference herein.

FIELD OF THE INVENTION

This invention relates to a method and apparatus for plasma etching a feature in a substrate. More particularly, the present invention relates to improving plasma etch uniformity by adjusting the position of the coil.

BACKGROUND OF THE INVENTION

Dry etching is a well established technology used in the manufacture of silicon-based semiconductor devices. It is also widely used in the manufacture of non silicon-based products (e.g., GaAs, InP materials) and non semiconductor products (e.g., micro-electro-mechanical-systems (MEMS) devices, hard drive head components, photomasks). All of these applications have a common requirement that a material is etched from a substrate, usually in a pattern defined by a mask such as photoresist or other non erodeable material. In some cases, the substrate itself is etched. To ensure that devices or features located at different locations within the substrate have the same characteristics, it is important that the etch is uniform over the whole area of the substrate. The level of etch uniformity required depends upon the specific application, but it is a general trend that as devices become more complex, the uniformity requirements become more stringent. Thus, although etch uniformities of 5% have previously been acceptable, there is becoming a need for uniformities of 1% or better.

An example is found in the manufacture of Alternating Aperture Phase Shift Masks (AAPSM) where it is necessary to etch a specific depth into a quartz photomask. This etch is required to create a 180° phase shift which, for the 65 nm lithography node, must be accurate to +/−1° of phase angle. This requires that the etched depth is uniform over the whole mask area to approx +/−0.5% (1% range).

High density plasma sources such as Inductively Coupled Plasma (ICP) have become widely accepted in dry etching. Such sources have the advantage of separate plasma density and ion energy control, and efficient plasma production at low pressure (<10 mT) where diffusion ensures good plasma uniformity.

However, even such sources cannot achieve uniformity at the 1% level. The plasma generation is degraded by minor variations introduced during the source construction, by application of the Radio Frequency (RF) and from interactions with the rest of the reactor. The majority of these variations can generally be divided into two classes, symmetric (e.g., radial) and asymmetric (e.g., side-to-side) variation. For ion driven processes (e.g., the Alternating Phase Shift Masks (AAPSM) quartz etch) these asymmetries result in an etch non-uniformity which is undesirable. A number of groups have proposed solutions to the radial non uniformity observed in inductive reactors. These solutions include inserts that physically displace the plasma (see Hieronymi et al. U.S. Pat. No. 5,391,281 and Johnson et al. U.S. Pat. No. 6,339,206), the use of multiple ICP coils (see Barnes U.S. Pat. No. 6,617,794 for example) and for spiral coils, modifying the axial spacing between the spiral coil and the dielectric plate (see Barnes U.S. Pat. No. 6,617,794 and Hashimoto U.S. Pat. No. 6,096,232).

While the methods described in the prior art improve the symmetric uniformity of the plasma, there is a need for an ICP source which can correct for asymmetric etch uniformity.

A number of groups have attempted to correct asymmetric non-uniformity. Yoshida et al. (U.S. Pat. No. 5,690,781) disclose a spiral coil ICP that is movable in the direction parallel to the main planar surface of the dielectric plate by a motor to control the distribution of the etching rate that is not symmetric about the center of the wafer. Yoshida et al. teach that the optimum location of the coil is when the center of gravity of the coil is matched with the axial center of the chamber. Yoshida et al. do not consider the case of radial coil movements for a helical ICP.

Barnes (U.S. Pat. No. 6,617,794) also discusses adjusting the position of ICP coils relative to the dielectric chamber wall. Barnes teaches axial movement of multiple coils that are located concentrically about the vertical axis of the processing chamber. Barnes does not consider radial coil movements to improve plasma density or etch rate uniformity Becker et al. (U.S. Pat. No. 6,531,031) disclose positioning a helical ICP coil such that the coil and the dielectric cylinder are not concentric. Becker et al. teach positioning the "hot" ends of a helical coil that is powered at both ends at a maximal distance from the ceramic reactor vessel. In this manner, the coil opposite the powered ends is in contact with the ceramic vessel (i.e., the ceramic reactor vessel is tangent to the coil at the location diametrically opposed to the powered coil ends). Becker et al. do not teach a coil that is adjustable along any radial direction in order to correct for an asymmetric etch non-uniformity.

Hashimoto (U.S. Pat. No. 6,096,232) teaches the use of process feedback to adjust the axial distance of a spiral inductor from a dielectric window. Hashimoto does not consider radial coil adjustments. In addition, Hashimoto does not contemplate the case of helical inductors.

Tanaka et al. (U.S. Pat. No. 6,210,539) disclose moving an ICP coil in the axial direction to improve the uniformity in sputtering systems. Tanaka et al. teach positioning the coil within the reactor chamber, at or below the plane of the substrate, to improve uniformity. Tanaka et al. do not consider adjusting the coil in the radial direction to improve asymmetric etch non-uniformity.

Holmann et al. (U.S. Pat. No. 6,217,718) teach tilting an ICP coil located within the plasma reactor relative to the substrate plane in order to affect asymmetric non-uniformity. Holmann et al. do not disclose tilting an externally located inductor.

Therefore, there is a need for improving the etch uniformity in an ICP plasma reactor having a helical inductor.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide an apparatus for etching a substrate comprising: a vacuum chamber; a support member in said vacuum chamber for holding the substrate; an etchant gas supply for providing an etchant gas to said vacuum chamber; an RF power source; a helical inductor disposed around or near a portion of said vacuum chamber, said helical inductor inductively coupling energy to said etchant gas to form a plasma in said vacuum chamber; an exhaust in fluid communication with said vacuum chamber; and a mechanism for varying the position of said helical inductor.

Yet another object of the present invention is to provide an apparatus for etching a substrate comprising: a vacuum chamber; a support member in said vacuum chamber for holding the substrate; an etchant gas supply for providing an etchant gas to said vacuum chamber; an RF power source; a helical inductor disposed around or near a portion of said vacuum chamber, said helical inductor inductively coupling energy to said etchant gas to form a plasma in said vacuum chamber; a sensor for measuring a process attribute; a mechanism for varying the position of said helical inductor; a controller connected to said sensor and said mechanism; and an exhaust in fluid communication with said vacuum chamber.

Still yet another object of the present invention is to provide a method for improving plasma uniformity in a plasma etching process, the method comprising: placing a substrate in a vacuum chamber; subjecting the substrate to an inductively coupled plasma etch process within said vacuum chamber; adjusting the position of a helical inductor; and removing the substrate from the vacuum chamber.

Another object of the present invention is to provide a method for improving plasma uniformity in a plasma etching process, the method comprising: placing a substrate in a vacuum chamber; subjecting the substrate to an inductively coupled plasma etch process within said vacuum chamber; measuring a process attribute; adjusting the position of a helical inductor based on said measuring step; and removing the substrate from the vacuum chamber.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises an improved method and an apparatus for improving the uniformity of plasma etching a substrate within using a helical inductor as part of an ICP plasma system.

A feature of the present invention is to provide an apparatus for etching a substrate or a film on a substrate. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. The apparatus comprising a vacuum chamber having at least one gas supply source for supplying at least one process gas into the vacuum chamber and an exhaust in communication with the vacuum chamber. The process gas is selected based on the associated process, i.e., etching of a material from the substrate. The substrate is placed on a lower electrode that resides within the vacuum chamber. A voltage supply is connected to the lower electrode for applying a bias voltage to the substrate. The voltage from the bias voltage supply can be RF or DC. A helical inductor is disposed around or near a portion of the vacuum chamber which generates a plasma within the vacuum chamber by inductively coupling energy to the process gas to form a plasma in the vacuum chamber. A mechanism is provided to vary the position of the helical inductor to adjust the generated plasma so that the uniformity of the etch across the substrate is improved.

Another feature of the present invention is to provide an apparatus for etching a substrate or a film on a substrate. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. The apparatus comprising a vacuum chamber having at least one gas supply source for supplying at least one process gas into the vacuum chamber and an exhaust in communication with the vacuum chamber. The process gas is selected based on the associated process, i.e., etching of a material from the substrate. The substrate is placed on a lower electrode that resides within the vacuum chamber. A voltage supply is connected to the lower electrode for applying a bias voltage to the substrate. The voltage from the bias voltage supply can be RF or DC. A helical inductor is disposed around or near a portion of the vacuum chamber wall which generates a plasma within the vacuum chamber by inductively coupling energy to the process gas to form a plasma in the vacuum chamber. The chamber wall near the inductive coil is a dielectric material. A conductive shield can be included which is positioned between the helical inductor and the dielectric chamber wall. A sensor is provided for measuring a process attribute of the plasma etch process. The sensor can be an optical monitor such as an optical emission spectroscopy monitor, a topographical monitor such as a laser reflectance monitor, a temperature monitor, a spatial monitor or an electrical monitor. The sensor sends a signal to a controller then uses the information from the signal to control a mechanism that varies the position of the helical inductor to adjust the generated plasma so that the uniformity of the etch across the substrate is improved. The movement of the helical inductor can be in a radial translation or a an angular tilt translation.

Still yet another feature of the present invention is to provide a method for improving plasma uniformity in a plasma etching process. The method comprising the placing of a substrate in a vacuum chamber. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. A helical inductor is disposed around or near a portion of the vacuum chamber which generates a plasma within the vacuum chamber by inductively coupling energy to the process gas to form a plasma in the vacuum chamber. The positioning of the helical inductor can be adjusted in a radial translation or a an angular tilt translation to improve the uniformity of the etch across the substrate. Finally, upon completion of the etch process, the substrate is removed from the vacuum chamber.

Another feature of the present invention is to provide a method for improving plasma uniformity in a plasma etching process. The method comprising the placing of a substrate in a vacuum chamber. The substrate can be a semiconductor substrate such as Silicon, Gallium Arsenide or any known semiconductor, including compound semiconductors e.g., Group II and Group VI compounds and Group III and Group V compounds. The substrate may also be a conductor or a dielectric material such as glass or quartz. A helical inductor is disposed around or near a portion of the vacuum chamber which generates a plasma within the vacuum chamber by inductively coupling energy to the process gas to form a plasma in the vacuum chamber. A process attribute of the plasma etch process is measured using a sensor. The process attribute can be a plasma condition (a plasma emission or a spatial condition) or a substrate measurement (a topographical measurement such as a laser reflectance measurement, a thermal measurement, an electrical measurement or an optical measurement). The sensor can be an optical monitor such as an optical emission spectroscopy monitor, a topographical monitor such as a laser reflectance monitor, a temperature monitor, a spatial monitor or an electrical monitor. The positioning of the helical inductor is adjusted based on the information of the process attribute gathered from the sensor. The helical inductor can be adjusted in a radial translation or a an angular tilt translation to improve the uniformity of the etch across the substrate. Finally, upon completion of the etch process, the substrate is removed from the vacuum chamber.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

We disclose an apparatus which improves plasma etch uniformity across a substrate through the mechanical adjustment of a helical ICP coil of a plasma etch system.

We also disclose the use of a sensor in an ICP plasma etch system for generating a signal indicative of a condition of the plasma and/or an attribute of the substrate that is then used to mechanically adjust a helical ICP coil in order to improve the plasma etch uniformity across a substrate.

Figure 1:
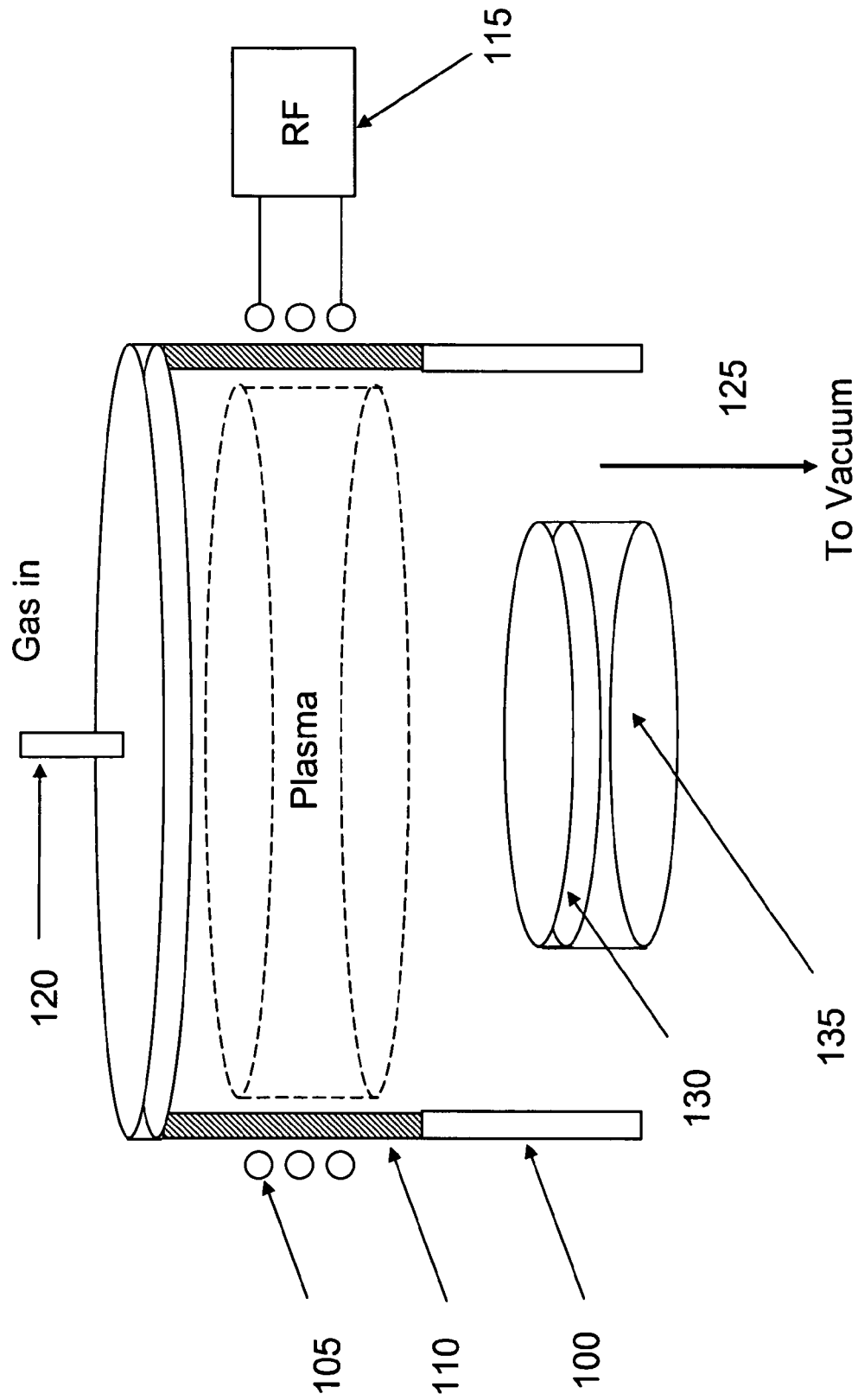
FIG. 1 is a schematic of a prior art ICP plasma reactor.

FIG. 1 is a schematic view of a prior art plasma reactor capable of processing substrates. The reactor can be applied to etching processes as well as deposition processes including plasma enhanced chemical vapor deposition (PECVD) and physical vapor deposition (PVD—e.g., sputter deposition). The reactor consists of a chamber 100 having a helical RF coil 105 positioned outside a cylinder 110. The cylinder is typically a dielectric (e.g., ceramic) though it may also be a semiconductor material. The inductor is helical in shape as is known in the art. A conductive shield (Faraday shield) can be placed between the RF coil 105 coil and the cylinder 110. An RF power source 115 supplies high frequency current to the coil 105. An impedance matching network (not shown) may be used to more efficiently couple the RF energy to the helical coil. In the case where the RF power supply 115 is capable of generating a range of frequencies, an impedance matching network may not be required. The chamber 100 also contains a means of introducing 120 and exhausting 125 process gas into the chamber and controlling the process pressure. The substrate 130 to be processed rests on a substrate support 135. The substrate support may be powered by a second RF power supply (not shown) as is known in the art to control the energy of ions impinging on the substrate 130.

Figure 2:
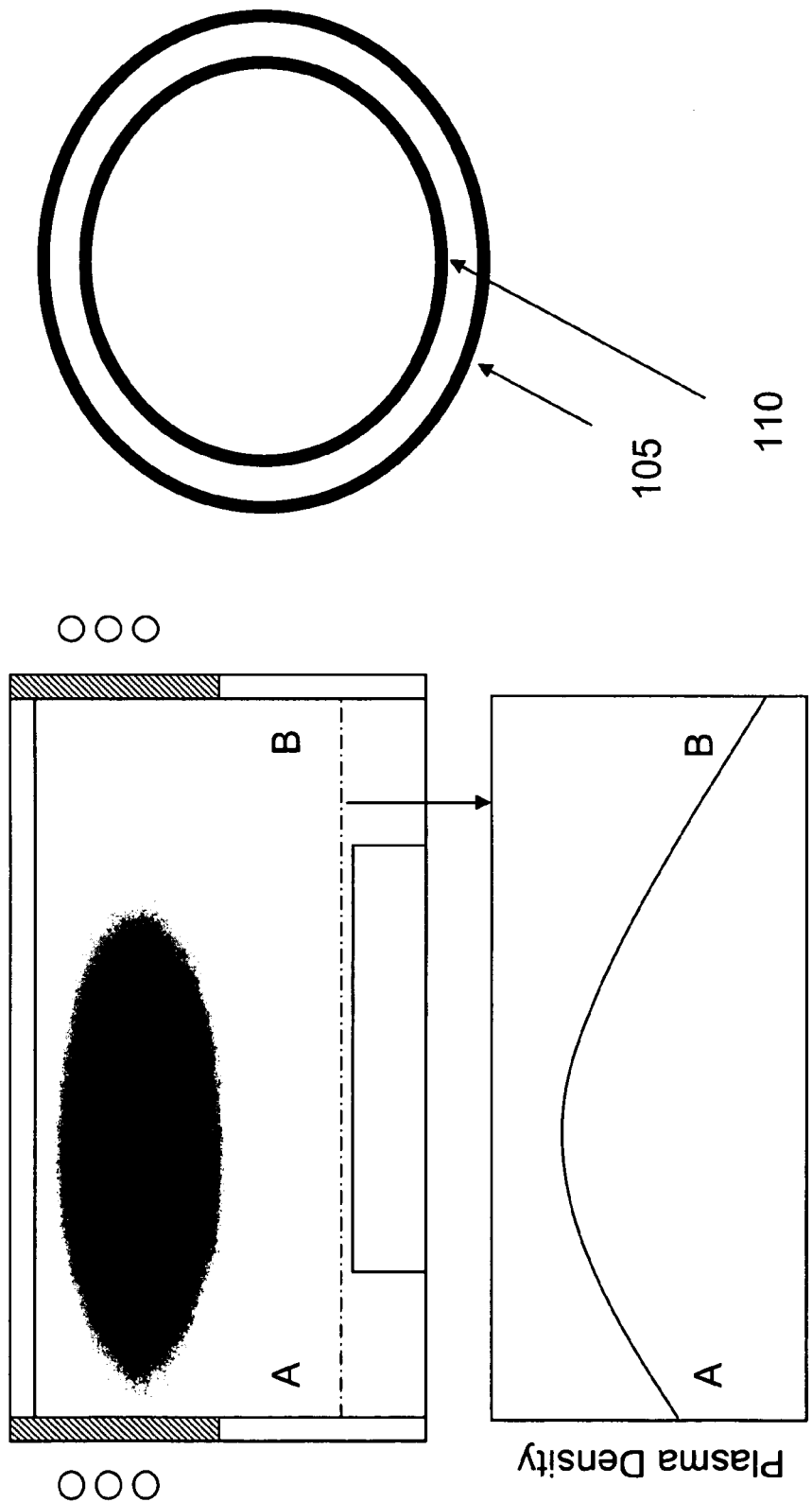
FIG. 2 is a cross section of the ICP reactor of FIG. 1 showing the plasma density distribution.

FIG. 2 shows a simplified cross section of the reactor shown in FIG. 1. In the case where the helical inductor is concentric with the reactor wall (dielectric cylinder) it is often observed that the plasma density uniformity within the chamber is radially shifted off-center on the wafer (e.g., one side of the substrate (point A) shows an etch rate different from another side (point B)). This effect may also be seen as a center shifted "bulls-eye" pattern on the substrate when a radial non-uniformity is also present. This shift may be attributable to either the source (e.g., plasma density non-uniformity—due to voltage gradient on the coil, standing wave effects, etc.) or other non-uniformity within the chamber (e.g., cathode non-uniformity, etc.).

Figure 3:
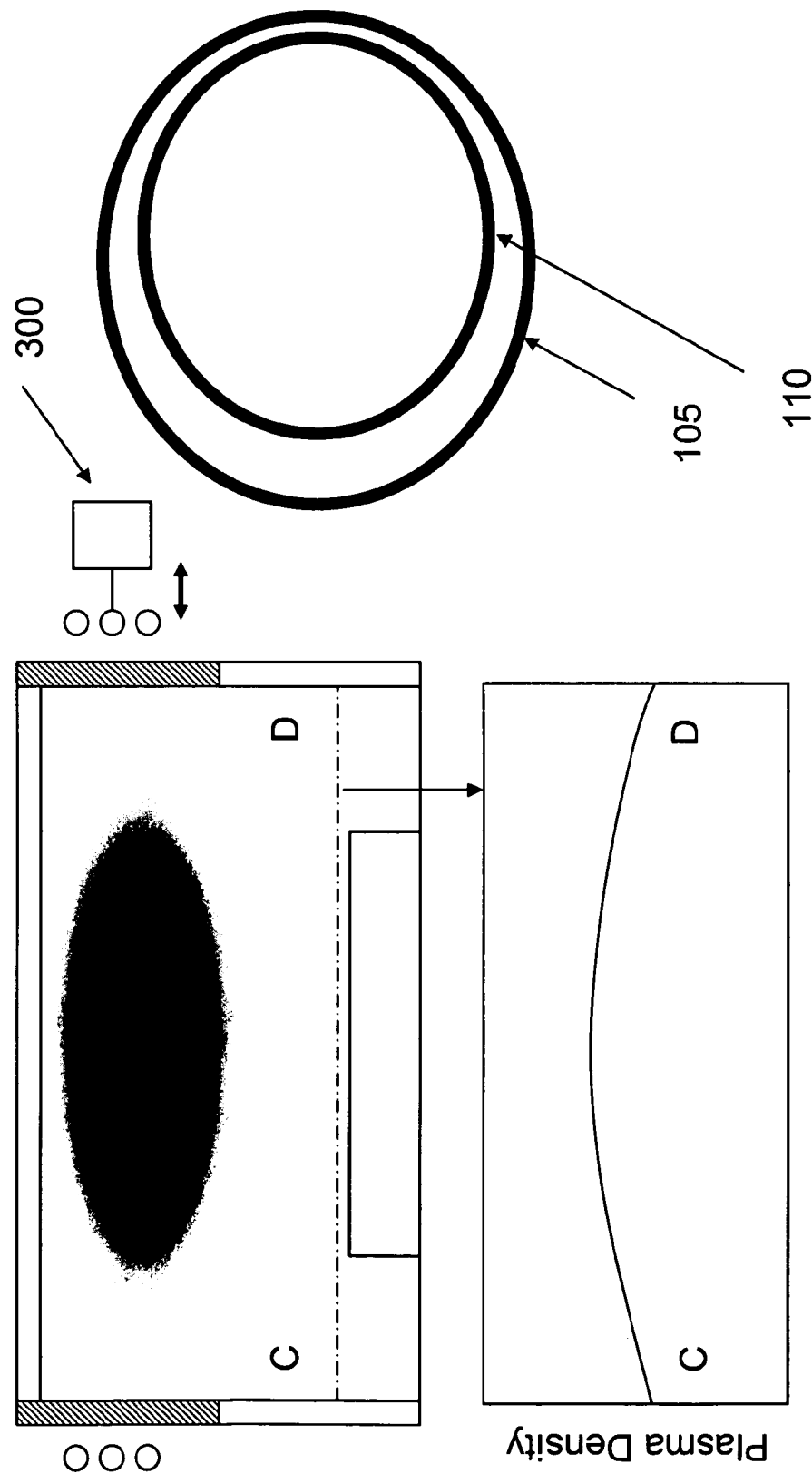
FIG. 3 is a cross section of an ICP reactor of an embodiment of the present invention showing the plasma density distribution after the helical inductor has been radially shifted off-center.

FIG. 3 shows an embodiment of the present invention where the helical inductor is radially shifted relative to the chamber wall in order to affect side-to-side non-uniformity (points C & D) within the chamber. In this manner the helical inductor is shifted such that it is no longer concentric with the reactor wall. This adjustment is accomplished by a mechanism 300 attached to the helical inductor 105.

Figure 4:
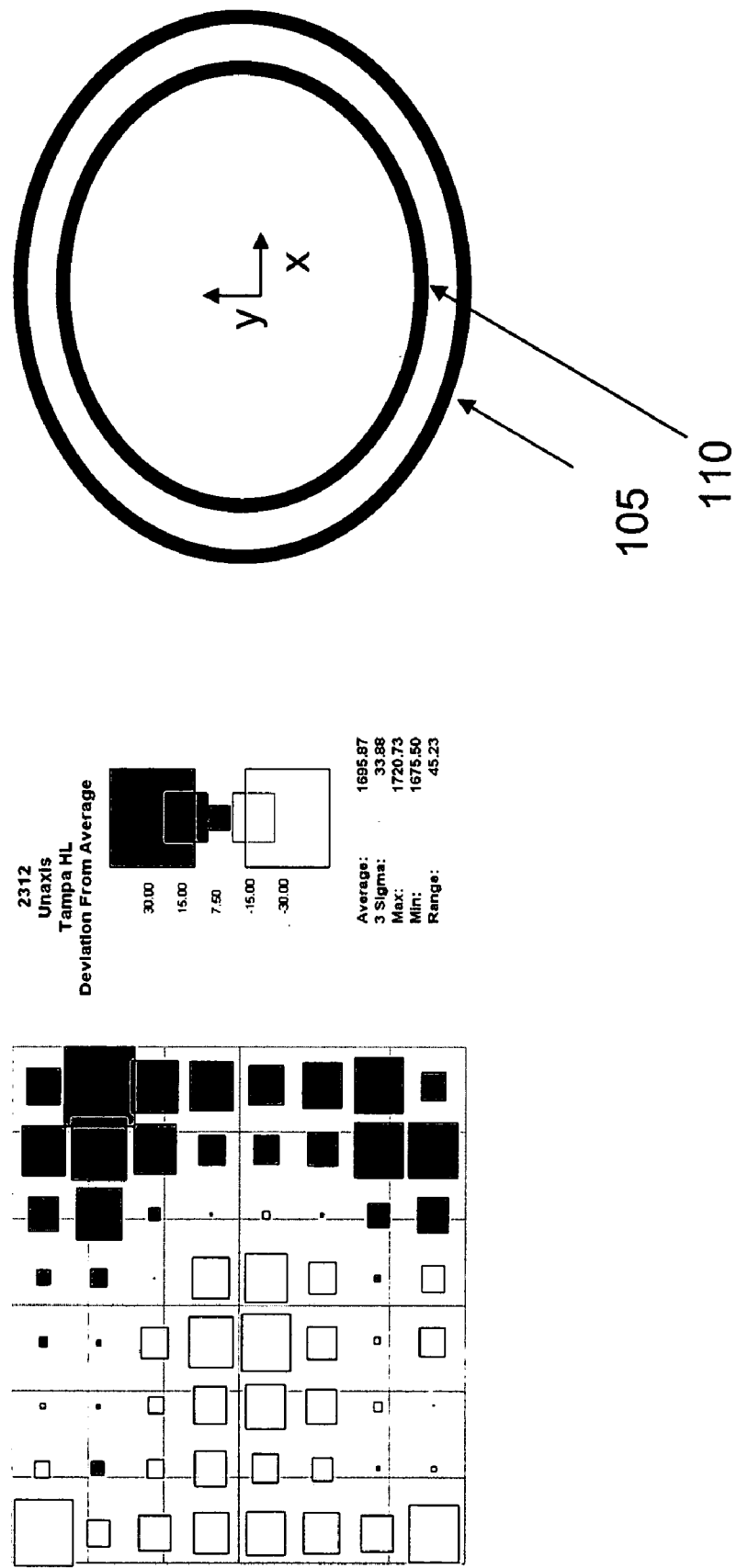
FIG. 4 shows the etch depth uniformity measurement for a prior art ICP plasma reactor.

FIG. 4 shows the experimental results obtained using the prior art configuration. A commercially available UNAXIS ICP plasma system utilizing a 45 cm diameter vacuum chamber and operated at 2 MHz was used as a source to etch 150 mm square quartz photomasks. The helical inductor was located 9.5 mm from the chamber wall. The photomask was located on a 35 cm diameter substrate support, biased at 13.56 MHz. Details of the process conditions used for the etch were:

| | |
|---|---|
| Ar | 90 sccm |
| CF4 | 10 sccm |
| Pressure | 7.2 mT |
| ICP power | 500 W |
| Bias power | 90 W |

The quartz etch depth was measured using a reflectance spectrometer. The measurements were made at 64 points distributed over the mask surface, so that the uniformity of the quartz etch could be determined. Using the above etch conditions, with the helical inductor concentric to the reactor wall, the etch rate uniformity was in the 2.6% range, with the observed pattern showing a side-to-side etch signature, with the highest etch rate on the right hand side of the substrate (see FIG. 4).

Figure 5:
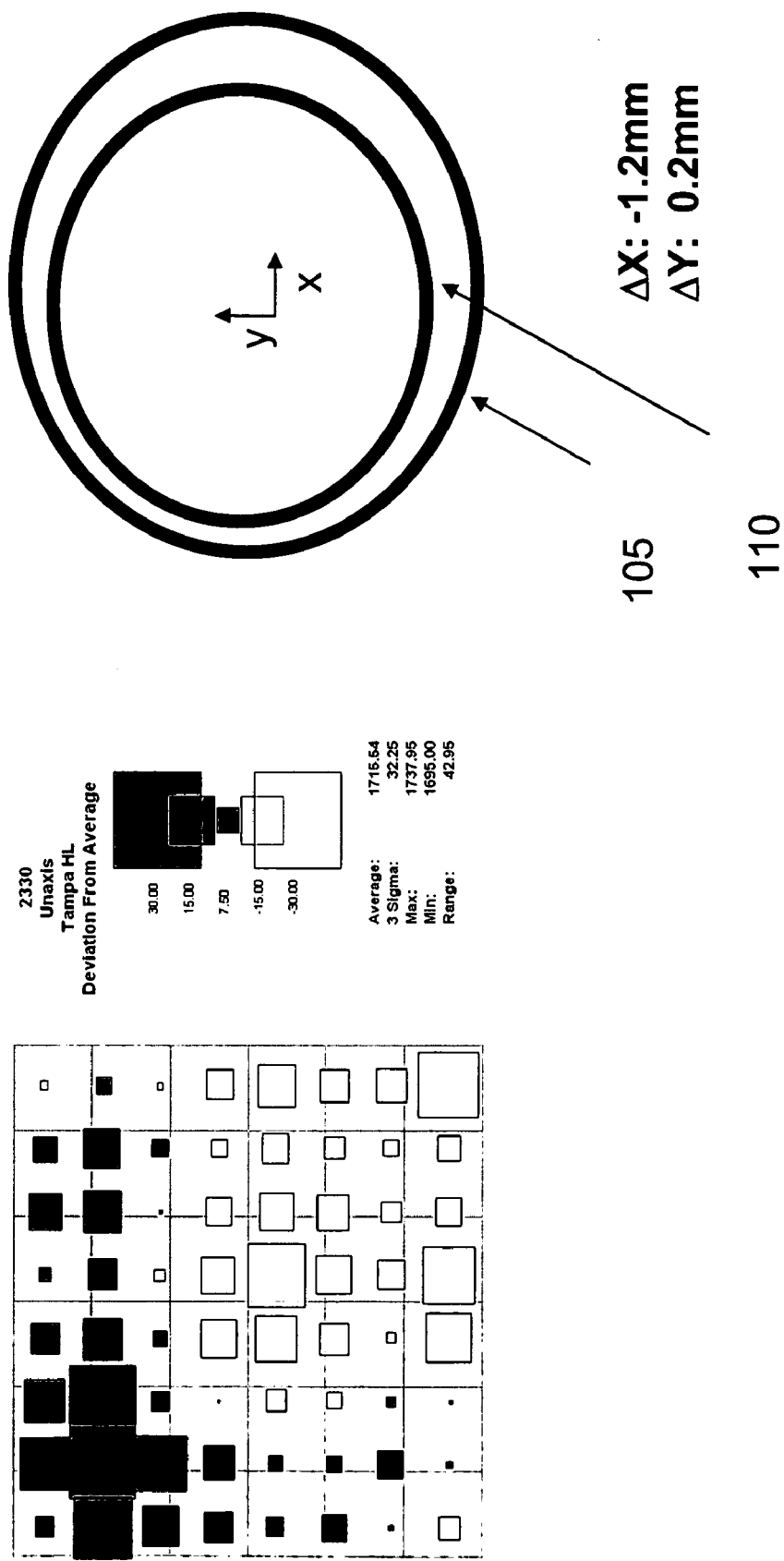
FIG. 5 shows the etch depth uniformity measurement for an embodiment of the present invention.

FIG. 5 shows the results of an experiment utilizing the first embodiment of the present invention where an adjustment mechanism was used to shift the coil relative to the reactor wall. The coil was shifted 1.2 mm in the negative "X" direction and 0.2 mm in the "Y" direction (see FIG. 5). The resulting etch rate uniformity was in the 2.5% range, with the observed pattern showing the side-to-side etch signature had been inverted (compare the etch signatures in FIGS. 4 and 5). The highest etch rate was now observed in the upper left corner of the substrate.

Figure 6:
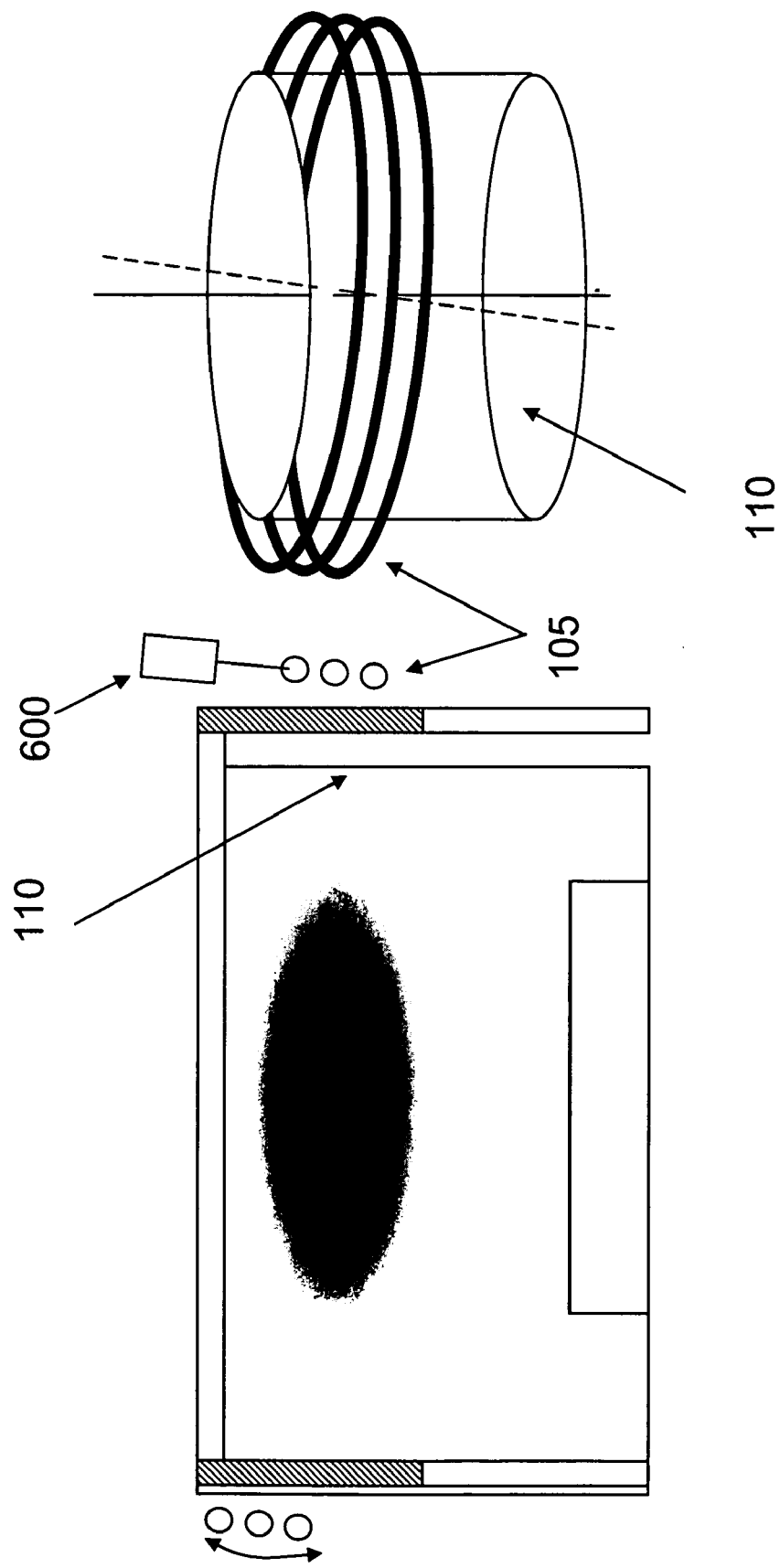
FIG. 6 is a cross section of an ICP reactor of another embodiment of the present invention showing the plasma density distribution after the helical inductor has been tilted relative to the chamber wall.

FIG. 6 shows an embodiment of the present invention where the helical inductor is tilted relative to the chamber wall in order to affect side-to-side non-uniformity within the chamber. The center axis of the helical inductor is tilted such that it is no longer perpendicular to the substrate plane. This adjustment is accomplished by a mechanism 600 attached to the helical inductor 105. In this embodiment the helical inductor may be concentric with or radially shifted relative to the reactor wall.

Figure 7:
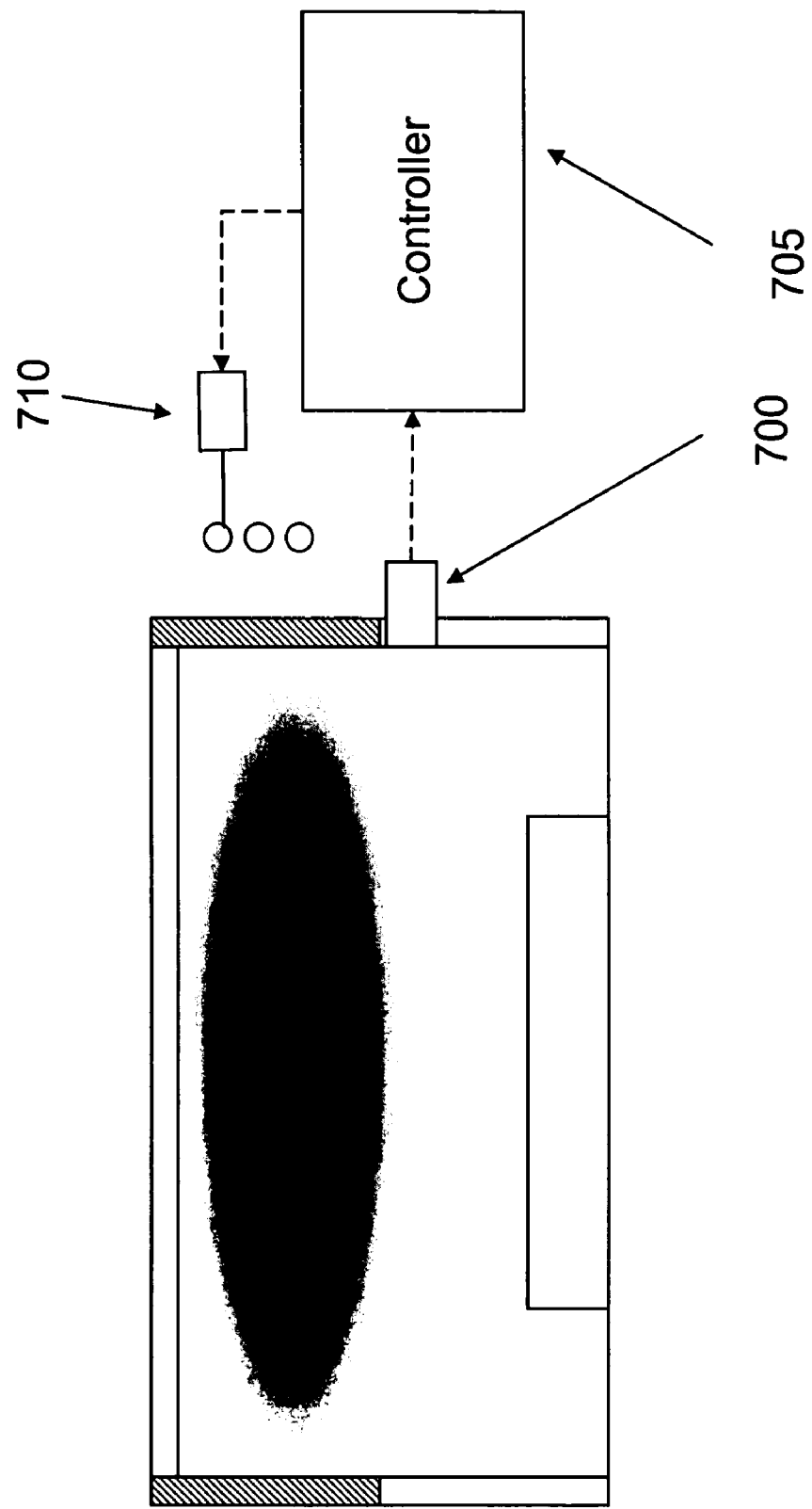
FIG. 7 is a cross section of an ICP reactor of another embodiment of the present invention where a sensor is used to measure a plasma condition to provide information to a controller to adjust the helical inductor by a mechanism.

FIG. 7 shows yet another embodiment of the present invention where a sensor 700 measures a condition of the plasma. The sensor is connected to a controller 705 that controls a mechanism 710 that adjusts the helical inductor position in response to the sensor measurement. The sensor may measure any number of parameters related to the plasma condition including, but not limited to electrical, magnetic, spatial and optical. One such method of measuring the plasma condition is through the plasma emission as is well known in the art.

Figure 8:
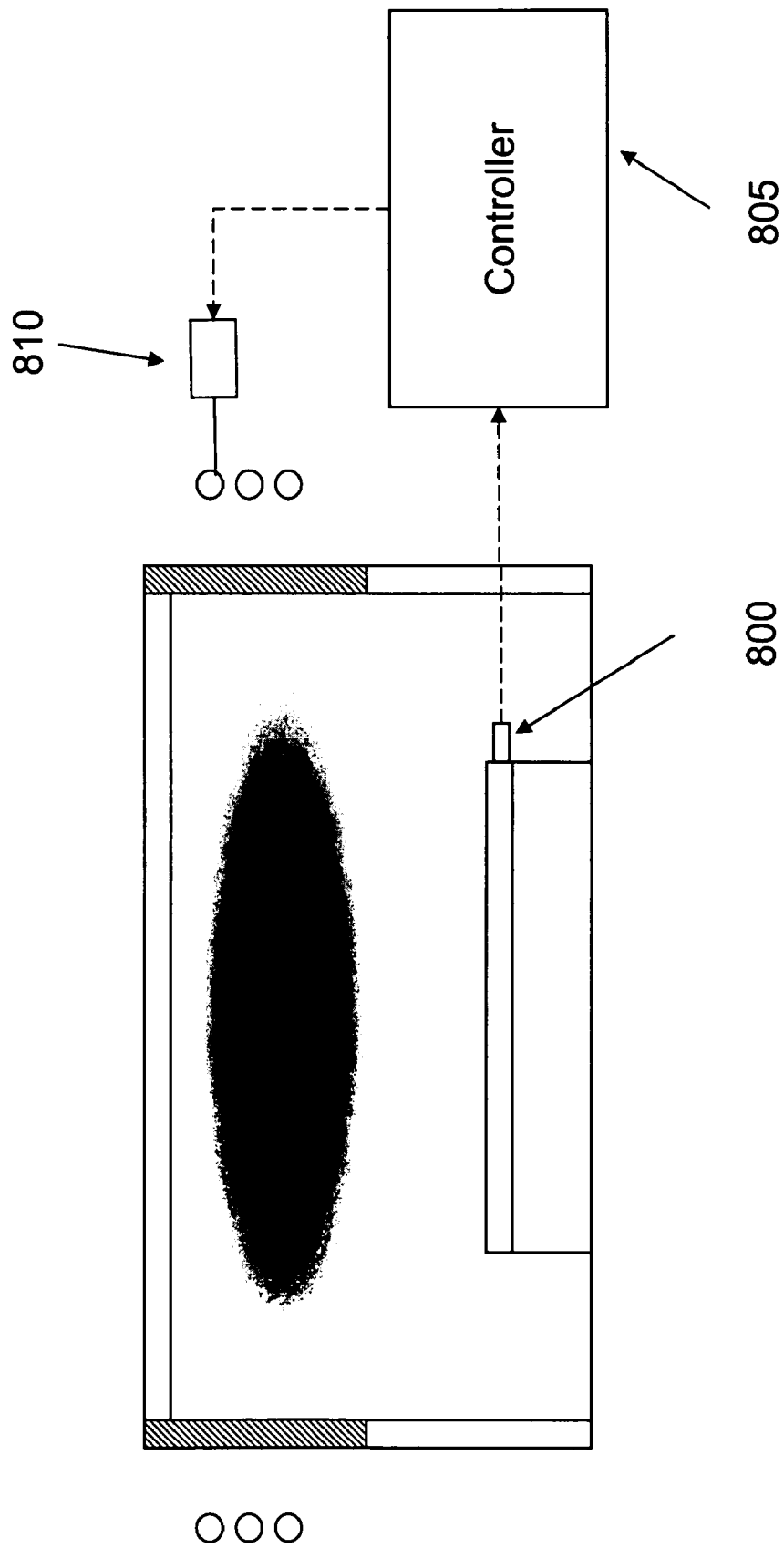
FIG. 8 is a cross section of an ICP reactor of another embodiment of the present invention where a sensor is used to measure an attribute of the substrate to provide information to a controller to adjust the helical inductor by a mechanism.

FIG. 8 shows yet another embodiment of the present invention where a sensor 800 measures an attribute of the substrate. The sensor is connected to a controller 805 that controls a mechanism 810 that adjusts the helical inductor position in response to the sensor measurement. The sensor may measure any number of attributes related to the substrate including, but not limited to electrical, thermal, topographical, spatial and optical. One such method of measuring the substrate condition is through the use of laser reflectance.

Therefore, the sensor in the present invention can measure any process attribute, e.g., an attribute of the substrate during the plasma etch process and/or a condition of the plasma during the plasma etch process.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

We claim:

1. A method for improving plasma uniformity in a plasma etching process, the method comprising:
    placing a substrate in a vacuum chamber, said vacuum chamber having a reactor wall;
    subjecting the substrate to an inductively coupled plasma etch process within said vacuum chamber;
    mechanically adjusting the position of a mechanically adjustable helical inductor in an "X" direction and in a "Y" direction relative to said reactor wall through a mechanism, said mechanism being attached to said mechanically adjustable helical inductor; and
    removing the substrate from the vacuum chamber.

2. The method of claim 1 wherein said helical inductor is adjusted in an angular tilt translation relative to said reactor wall by said mechanism.

3. A method for improving plasma uniformity in a plasma etching process, the method comprising:
    placing a substrate in a vacuum chamber, said vacuum chamber having a reactor wall;
    subjecting the substrate to an inductively coupled plasma etch process within said vacuum chamber;
    measuring a process attribute;
    mechanically adjusting the position of a mechanically adjustable helical inductor in an "X" direction and in a "Y" direction relative to said reactor wall through a mechanism, said mechanism being attached to said mechanically adjustable helical inductor, said adjustment of said mechanically adjustable helical inductor being based on said measuring step; and
    removing the substrate from the vacuum chamber.

4. The method of claim 3 wherein said process attribute is a plasma condition.

5. The method of claim 4 wherein said plasma condition is a plasma emission.

6. The method of 4 wherein said plasma condition is a spatial condition.

7. The method of claim 3 wherein said process attribute is a substrate measurement.

8. The method of claim 7 wherein said substrate measurement is a topographical measurement.

9. The method of claim 8 wherein said topographical measurement is a laser reflectance measurement.

10. The method of claim 7 wherein said substrate measurement is a thermal measurement.

11. The method of claim 7 wherein said substrate measurement is an electrical measurement.

12. The method of claim 7 wherein said substrate measurement is an optical measurement.

* * * * *